US011552201B2

(12) United States Patent
Yang

(10) Patent No.: US 11,552,201 B2
(45) Date of Patent: Jan. 10, 2023

(54) OPTICAL PACKAGE ASSEMBLY AND MOBILE TERMINAL

(71) Applicant: VIVO MOBILE COMMUNICATION CO., LTD., Chang'an Dongguan (CN)

(72) Inventor: Wanglai Yang, Chang'an Dongguan (CN)

(73) Assignee: VIVO MOBILE COMMUNICATION CO., LTD., Guangdong (CN)

( * ) Notice: Subject to any disclaimer, the term of this patent is extended or adjusted under 35 U.S.C. 154(b) by 0 days.

(21) Appl. No.: 17/182,881

(22) Filed: Feb. 23, 2021

(65) Prior Publication Data
US 2021/0217902 A1    Jul. 15, 2021

Related U.S. Application Data

(63) Continuation of application No. PCT/CN2019/096698, filed on Jul. 19, 2019.

(30) Foreign Application Priority Data

Aug. 30, 2018    (CN) .......................... 201811010221.1

(51) Int. Cl.
*H01L 31/0203*    (2014.01)
*H01L 31/0232*    (2014.01)
(Continued)

(52) U.S. Cl.
CPC .... *H01L 31/0203* (2013.01); *H01L 31/02325* (2013.01); *H05K 5/0017* (2013.01); *H05K 5/03* (2013.01); *H05K 2201/10454* (2013.01)

(58) Field of Classification Search
CPC .......... H01L 31/0203; H01L 31/02325; H01L 27/14618; H01L 27/14629;
(Continued)

(56) References Cited

U.S. PATENT DOCUMENTS 10,555,436 B1 *  2/2020  Kalyanasundaram ...................... H05K 7/20209
2011/0050989 A1   3/2011  Kim
(Continued)

FOREIGN PATENT DOCUMENTS

| CN | 103487838 A | 1/2014 |
| CN | 106302878 A | 1/2017 |

(Continued)

OTHER PUBLICATIONS

Search Report for related Chinese Application No. 201811010221.1; report dated Mar. 13, 2020.
(Continued)

*Primary Examiner* — Thanh Luu
*Assistant Examiner* — Monica T Taba
(74) *Attorney, Agent, or Firm* — von Briesen & Roper, s.c.

(57) ABSTRACT

Disclosed is an optical package assembly. The optical package assembly includes a substrate (100), a light sensor chip (200), and a protection portion. The protection portion and the light sensor chip (200) both are fixed to the substrate (100), the light sensor chip (200) is packaged in the protection portion, a plane on which the light sensor chip (200) is located intersects with a plane of the substrate (100), and the protection portion includes a light entering region. Further disclosed is a mobile terminal.

5 Claims, 4 Drawing Sheets

(51) Int. Cl.
*H05K 5/00* (2006.01)
*H05K 5/03* (2006.01)

(58) Field of Classification Search
CPC .. H01L 27/14634; H05K 5/0017; H05K 5/03; H05K 2201/10454; H05K 2201/10484; H04M 2250/12; H04M 1/026
See application file for complete search history.

(56) References Cited

U.S. PATENT DOCUMENTS

| | | | |
|---|---|---|---|
| 2014/0166867 A1 | 6/2014 | Shiu et al. | |
| 2018/0081085 A1* | 3/2018 | Ge | G02B 1/18 |
| 2018/0175237 A1* | 6/2018 | Linkov | H01L 33/486 |
| 2019/0113695 A1* | 4/2019 | Heroux | G02B 6/422 |
| 2019/0267334 A1* | 8/2019 | Bowers | H01L 24/81 |

FOREIGN PATENT DOCUMENTS

| | | |
|---|---|---|
| CN | 107367803 A | 11/2017 |
| CN | 107945683 A | 4/2018 |
| CN | 108040155 A | 5/2018 |
| CN | 108111643 A | 6/2018 |
| CN | 108415514 A | 8/2018 |
| CN | 108418909 A | 8/2018 |
| CN | 108462767 A | 8/2018 |
| CN | 109244093 A | 1/2019 |

OTHER PUBLICATIONS

Office Action for related Chinese Application No. 201811010221.1; report dated Jul. 3, 2020.

Written Opinion for related International Application No. PCT/CN2019/096698; report dated Mar. 11, 2021.

Extended European Search Report related to Application No. 19854240.9; report dated Oct. 11, 2021.

* cited by examiner

OPTICAL PACKAGE ASSEMBLY AND MOBILE TERMINAL

CROSS-REFERENCE TO RELATED APPLICATIONS

This application claims is a continuation application of International Application No. PCT/CN2019/096698 filed on Jul. 19, 2019, which priority to Chinese Patent Application No. 201811010221.1 filed in China on Aug. 30, 2018, both disclosures of which are incorporated herein by reference in their entireties.

TECHNICAL FIELD

The present disclosure relates to the field of mobile terminal design technologies, and in particular, to an Optical Package Assembly and a mobile terminal.

BACKGROUND

Currently, there are various types of mobile terminals on the market, for example, a mobile phone, a wearable device, and a computer. As user demands increase, performance of a current mobile terminal is optimized continuously, and a demand for light sensor chips in mobile terminals is increasing. As the current mobile terminal develops towards a direction of large screen, space for installation of a light sensor chip in the mobile terminal is becoming more limited. Based on this, the current mobile terminal usually uses a ribbon-shaped light sensor chip, and a width of the light sensor chip is reduced as much as possible to reduce a black border of a screen of the mobile terminal.

The light sensor chip usually is attached to a substrate in the mobile terminal. Even if the width of the light sensor chip is reduced, the light sensor chip still occupies large space. This undoubtedly makes the black border of the screen of the mobile terminal wide and affects a further increase of a screen-to-body ratio of the mobile terminal. In addition, optical performance of the light sensor chip needs to be balanced with its size. When the size of the light sensor chip is reduced to a particular extent, a process technology hardly enables a further decrease. Obviously, it is difficult to solve, only by reducing a size of a light sensor chip, a problem that the screen-to-body ratio of the current mobile terminal can be hardly increased.

On such basis, a package assembly formed after the light sensor chip is packaged is still large and occupies a large width, eventually leading to a small screen-to-body ratio of the mobile terminal.

SUMMARY

An optical package assembly includes a substrate, a light sensor chip, and a protection portion. The protection portion and the light sensor chip both are fixed to the substrate, the light sensor chip is packaged in the protection portion, a plane on which the light sensor chip is located intersects with a plane of the substrate, and the protection portion includes a light entering region.

A mobile terminal includes a display module, a housing with a frame, and the optical package assembly described above. The display module includes a display screen and a transparent cover plate covering the display screen, the transparent cover plate is fixed to the frame in a bonding manner, the optical package assembly is disposed in accommodation space formed by the transparent cover plate and the housing and is located between the frame and the display screen, and a light sensing region of the light sensor chip faces to the frame.

BRIEF DESCRIPTION OF DRAWINGS

The accompanying drawings illustrated herein are provided to further understand the present disclosure and form a part of the present disclosure. The exemplary embodiments of the present disclosure and the descriptions thereof are used to explain the present disclosure and do not constitute an improper limitation on the present disclosure. In the accompanying drawings.

REFERENCE NUMERALS

Figure 1:
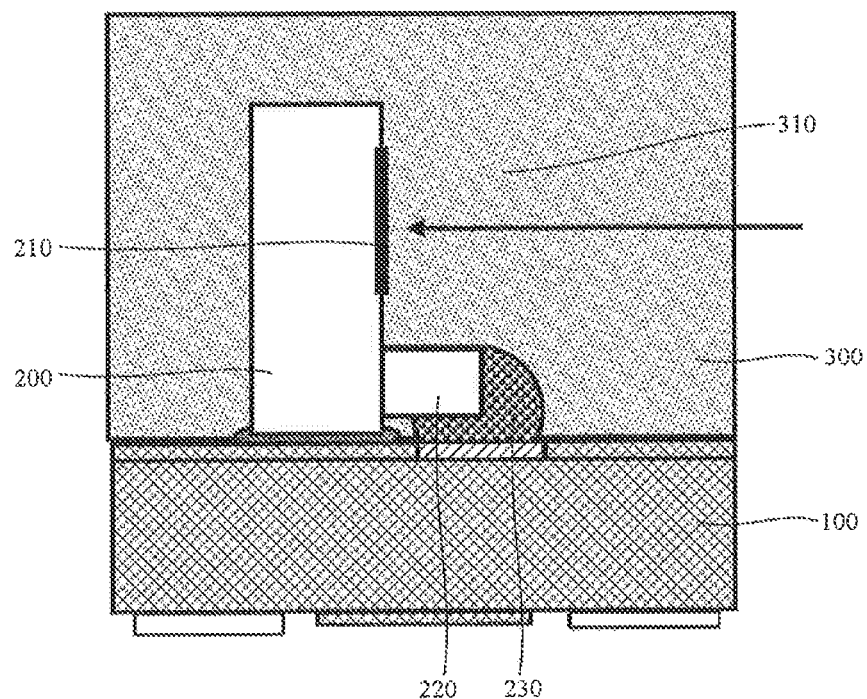
FIG. 1 is a schematic structural diagram of a first optical package assembly according to an embodiment of the present disclosure.

100: Substrate; 200: light sensor chip; 210: light sensing region; 220: pin; 230: solder; 300: sealing compound portion; 310: light entering region; 400: sealing compound portion; 410: light entering region; 500: first reflector; 600: package cover; 610: inner cavity; 620: light entering region; 700: package cover; 710: inner cavity; 720: light entering region; 800: second reflector; 900: display module; 910: display screen; 920: transparent cover plate; 1000: housing; 1100: frame; and 1110: light entering hole.

DETAILED DESCRIPTION OF EMBODIMENTS

To make the objectives, technical solutions, and advantages of the present disclosure clearer, the following clearly describes the technical solutions in the present disclosure with reference to specific embodiments of the present disclosure and the corresponding accompanying drawings. Apparently, the described embodiments are some rather than all of the embodiments of the present disclosure. All other embodiments obtained by a person of ordinary skill in the art based on the embodiments of the present disclosure without creative efforts shall fall within the protection scope of the present disclosure.

The technical solutions disclosed in the embodiments of the present disclosure are described in detail with reference to the accompanying drawings.

Referring to FIG. 1 to FIG. 5, an embodiment of the present disclosure discloses an optical package assembly. The disclosed optical package assembly includes a substrate 100, a light sensor chip 200, and a protection portion.

The substrate 100 is the basis of the entire optical package assembly. The light sensor chip 200 is fixed to the substrate 100 and is packaged in the protection portion. The protection portion plays a role of package protection. A plane on which the light sensor chip 200 is located intersects with a plane of the substrate 100. The protection portion includes a light entering region, and the light entering region can enable ambient light to enter the protection portion, so that the light sensor chip 200 senses the light.

In this embodiment, the light sensor chip 200 is a light sensing component, and thickness of the light sensor chip is smaller than a size in another direction. The protection portion and the light sensor chip 200 both are fixed to the substrate 100. The light sensor chip 200 intersects with the plane of the substrate 100. In a related technology, the light sensor chip 200 is attached to the plane of the substrate 100, and it may be considered that the light sensor chip 200 is parallel to the plane of the substrate 100. In this case, the light sensor chip 200 occupies wider space in a width direction F1 of a frame of a mobile terminal. The plane on which the light sensor chip 200 is located intersects with the plane of the substrate 100. Then, it may be considered that one end of the light sensor chip 200 is high, and the other end is low, so that a width of space occupied in the width direction F1 of the frame can be reduced.

The optical package assembly disclosed in the embodiments of the present disclosure changes a conventional thinking of always making a design in a direction of reducing a size of the light sensor chip 200. The light sensor chip 200 is fixed to the substrate 100 in such a manner that the plane on which the light sensor chip 200 is located intersects with the plane of the substrate 100, and then, the light sensor chip is packaged by using the protection portion. Compared with a mounting manner that the light sensor chip is attached to the substrate, based on the manner that the plane on which the light sensor chip 200 is located intersects with the plane of the substrate 100 can undoubtedly reduce a width of space occupied by the light sensor chip 200, thereby reducing a width of the optical package assembly to a greater extent. In addition, a mobile terminal equipped with the optical package assembly disclosed in the present disclosure can undoubtedly have a screen with a narrower black border, to easily increase a screen-to-body ratio of the mobile terminal.

In a specific implementation, the plane on which the light sensor chip 200 is located is perpendicular to the plane of the substrate 100, and it may be considered that the light sensor chip 200 is located upright on the plane of the substrate 100. The plane on which the light sensor chip 200 is located is perpendicular to the plane of the substrate 100, so that a size of the light sensor chip 200 in the width direction F1 of the frame of the mobile terminal is thickness d of the light sensor chip 200. Because the light sensor chip 200 is thin, a width of the optical package assembly can be reduced to the greatest extent.

In this embodiment, the light sensor chip 200 includes a light sensing region 210, and the protection portion packages the light sensor chip 200, to play roles of packaging and protection. The protection portion needs to be provided with a light entering region, to ensure that ambient light can enter the light sensing region 210, to implement light sensing.

Optionally, the substrate 100 is a circuit board. When the substrate 100 is a circuit board, the light sensor chip 200 is fixed to the substrate 100, so that the substrate 100 can supply power. The substrate 100 may be a specific circuit board that provides a mounting basis for the light sensor chip 200 in the mobile terminal, or may be a master board or a slave board of the mobile terminal. For the convenience of assembly, in an optional solution, the substrate 100 is a circuit board belongings only to the optical package assembly, and after the optical package assembly is formed, the substrate 100 may be attached to the master board of the mobile terminal, to implement integral mounting of the optical package assembly.

The light sensor chip 200 may be adhered to the substrate 100 by using glue, or may be welded to the substrate 100. The light sensor chip 200 generally includes a pin 220, the pin 220 may be welded to a pad of the substrate 100 by using solder 230, and the pin 220 is electrically connected to the substrate 100. In a specific implementation, the pin 220 is electrically connected to the substrate 100 through soldering. A manner of welding using the solder 230 not only can implement an electrical connection between the light sensor chip 200 and the substrate 100, but also can assist in fixing the light sensor chip 200.

The pin 220 may have a plurality of structures, in a specific implementation, the pin 220 may be a hump protruding from a surface on one side of the light sensor chip 200.

The protection portion has a plurality of structures, and may be formed in a plurality of manners provided that the light sensor chip 200 can sense ambient light after the light sensor chip is packaged. Referring to FIG. 1, a first protection portion disclosed in this embodiment may be a sealing compound portion 300, and the sealing compound portion 300 is transparent glue. The sealing compound portion 300 includes a light entering region 310, and the light entering region 310 is disposed opposite to a light sensing region 210 of the light sensor chip 200. In this case, ambient light entering the protection portion from the light entering region 310 can be directly projected onto the light sensing region 210. In a packaging process, the optical package assembly is mounted in a housing the mobile terminal, and the light sensing region 210 may directly face to the frame. In this case, a hole is directly formed on the frame, and there is no need to form a light entering hole on a plane on which a display screen is mounted on the mobile terminal. This undoubtedly further increases a screen-to-body ratio of the mobile terminal.

Figure 2:
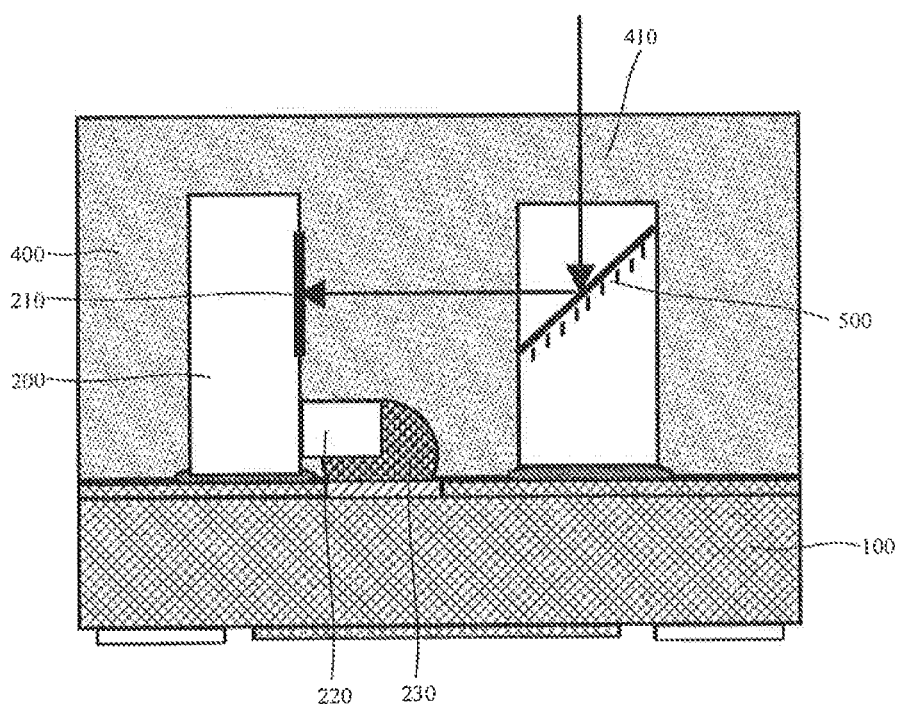
FIG. 2 is a schematic structural diagram of a second optical package assembly according to an embodiment of the present disclosure.

Referring to FIG. 2, a second protection portion disclosed in this embodiment may also be a sealing compound portion 400. The sealing compound portion 400 is transparent glue, and the sealing compound portion 400 includes a light entering region 410, a light entering direction of the light entering region 410 intersects with an orientation of a light sensing region 210 of the light sensor chip 200, a first reflector 500 is disposed in the sealing compound portion 400, and the first reflector 500 is used to receive ambient light that enters the light entering region 410, and reflect the ambient light to the light sensing region 210. This manner can enable the optical package assembly to be mounted in the housing of the mobile terminal, and adapt to light entering from a light entering hole formed on a transparent cover plate of a display module of the mobile terminal. In a specific implementation, the orientation of the light sensing region 210 may be perpendicular to the light entering direction of the light entering region 410.

The sealing compound portion 400 may be completely made of transparent glue, or only the light entering region is made of transparent glue. Specifically, a shape of the light entering region may be determined based on a light entering hole on the housing of the mobile terminal.

The sealing compound portion 300 and the sealing compound portion 400 may implement packaging through solidification of glue. After solidification, the light sensor chip 200 is surrounded by solidified glue. Therefore, the protection portion of the structure can improve packaging stability of the optical package assembly.

Figure 3:
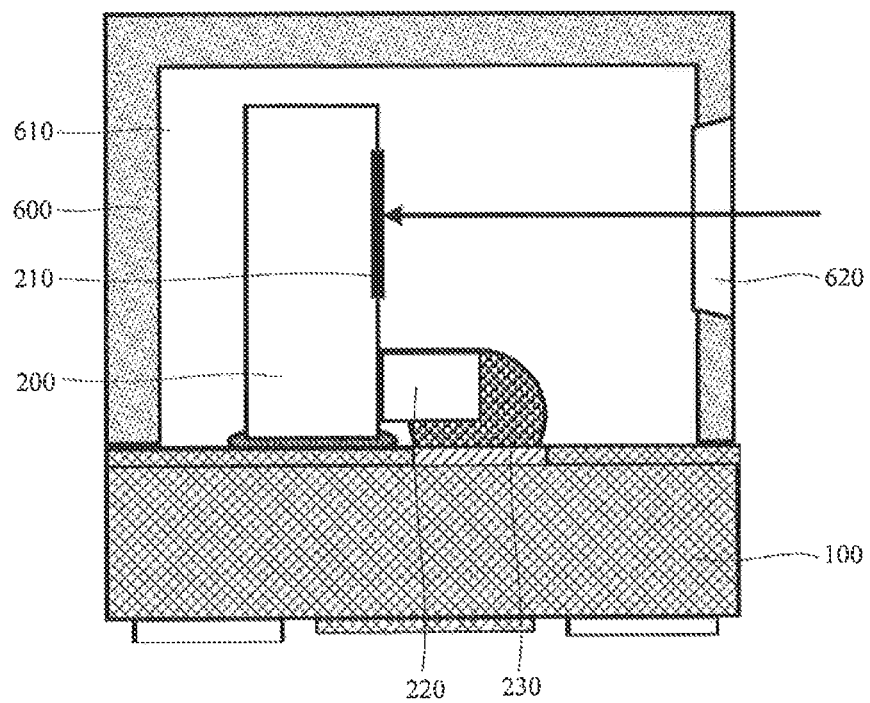
FIG. 3 is a schematic structural diagram of a third optical package assembly according to an embodiment of the present disclosure.

Referring to FIG. 3, a third protection portion disclosed in this embodiment of the present disclosure may be a package cover 600. The package cover 600 has an inner cavity 610, and the light sensor chip 200 is disposed in the inner cavity 610. The package cover 600 includes a light entering region 620, and the light entering region 620 is disposed opposite to a light sensing region 210. In a packaging process, the optical package assembly is mounted in a housing of the mobile terminal, and the light sensing region 210 may directly face to the frame. In this case, a hole is directly formed on the frame, and there is no need to form a light entering hole on a plane on which a display screen is mounted on the mobile terminal. This undoubtedly further increases a screen-to-body ratio of the mobile terminal.

Regions on the package cover 600 may be a non-transparent region, except for the light entering region 620, so that interference of light from the another region other than the light entering region 620 can be reduced as much as possible.

Figure 4:
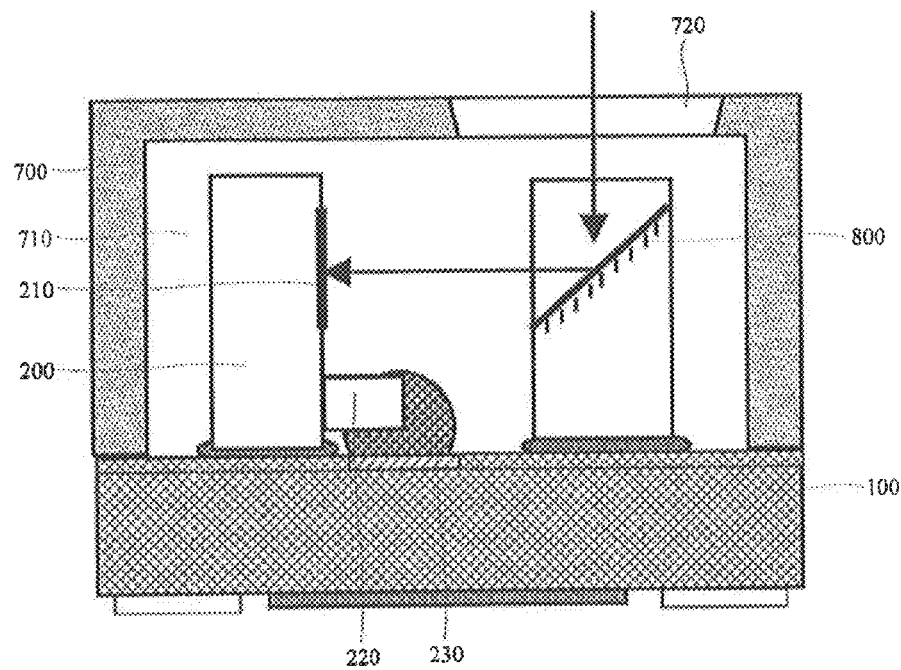
FIG. 4 is a schematic structural diagram of a fourth optical package assembly according to an embodiment of the present disclosure.

Referring to FIG. 4, a fourth protection portion disclosed in this embodiment of the present disclosure may be a package cover 700, The package cover 700 has an inner cavity 710, and the light sensor chip 200 is disposed in the inner cavity 710. The package cover 700 includes a light entering region 720, a light entering direction of the light entering region 720 intersects with an orientation of a light sensing region 210 of the light sensor chip 200, a second reflector 800 is disposed in the inner cavity 710, and the second reflector 800 is used to receive ambient light that enters the light entering region 410, and reflect the ambient light to the light sensing region 210. This manner can enable the optical package assembly to be mounted in the housing of the mobile terminal, and adapt to light entering from a light entering hole formed on a transparent cover plate of a display module of the mobile terminal. In a specific implementation, the light entering direction of the light entering region 720 may be perpendicular to the orientation of the light sensing region 210.

As described above, when the optical package assembly is mounted in the mobile terminal, the light sensing region 210 of the light sensor chip 200 faces to the frame of the mobile terminal, and the light entering region of the protection portion may face to the frame, to receive ambient light received from the light entering hole on the frame. Certainly, the light entering region may alternatively face to the transparent cover plate of the mobile terminal, and receive ambient light through the light entering hole on the transparent cover plate.

Figure 5:
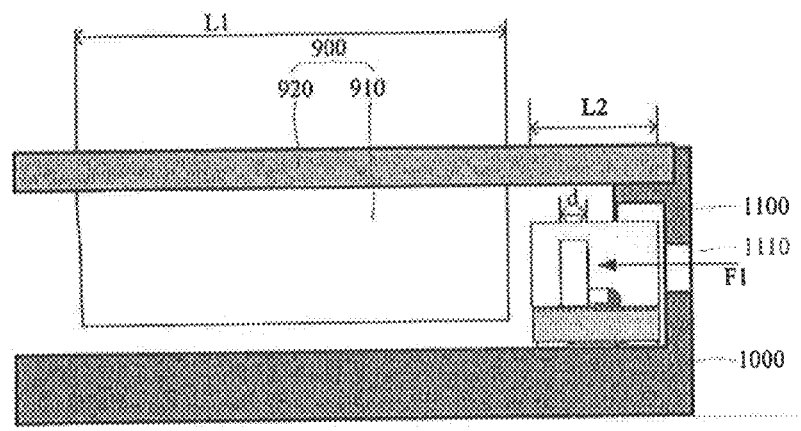
FIG. 5 is a schematic diagram of a partial structure of a mobile terminal according to an embodiment of the present disclosure.

Based on the optical package assembly disclosed in the embodiments of the present disclosure, an embodiment of the present disclosure discloses a mobile terminal. As shown in FIG. 5, the disclosed mobile terminal may include a display module 900, a housing 1000 with a frame 1100, and the optical package assembly described above. The display module 900 includes a display screen 910 and a transparent cover plate 920 covering the display screen 910, the transparent cover plate 920 is fixed to the frame 1100 in a bonding manner, the optical package assembly is disposed in accommodation space formed by the transparent cover plate 920 and the housing 1000 and is located between the frame 1100 and the display screen 910, and a light sensing region 210 faces to the frame 1100. In addition, an orthogonal projection L2 of the optical package assembly onto the transparent cover plate 920 does not overlap an orthogonal projection L1 of the display screen 910 onto the transparent cover plate 920.

As described above, there are a plurality of manners of disposing the light entering region, and there are a plurality of relative location relationships between the light entering region and the light sensing region 210. Correspondingly, there are a plurality of locations for forming the light entering hole on the mobile terminal. Usually, the light entering hole is formed on the transparent cover plate 920. In a specific implementation, the light entering region faces to the transparent cover plate 920, the light entering hole is formed on the transparent cover plate 920, and the light entering hole is used to guide the ambient light to the light entering region.

In an optional solution, the light entering region faces to the flame 1100, the light entering hole 1110 is formed on the frame 1100, and the light entering hole 1110 is used to guide the ambient light to the light entering region, Based on the structure, the light entering hole 1110 can be formed on the frame of the mobile terminal to implement light entering, and there is no need to form the light entering hole on the transparent cover plate 920. Therefore, a full screen mobile terminal with no hole on a screen can be formed.

The mobile terminal disclosed in this embodiment of the present disclosure may be a smartphone, a tablet computer, a wearable device, or the like. A specific type of the mobile terminal is not limited in this embodiment of the present disclosure.

The embodiments of the present disclosure emphasize on differences between the embodiments. Different optimization features between the embodiments can be combined to form a better embodiment provided that there is no contradiction. For brief description, details are not described herein again.

The foregoing descriptions are merely embodiments of the present disclosure, but are not intended to limit the present disclosure. A person skilled in the art may make various modifications and changes to the present disclosure. Any modification, equivalent replacement, or improvement made within the spirit and principle of the present disclosure shall fall within the protection scope of the claims of the present disclosure.

The invention claimed is:

1. A mobile terminal, comprising: a display module, a housing with a frame, and an optical package assembly, wherein the optical package assembly comprises: a substrate, a light sensor chip, and a protection portion, wherein the protection portion and the light sensor chip both are fixed to the substrate, the light sensor chip is packaged in the protection portion, a plane on which the light sensor chip is located intersects with a plane of the substrate, and the protection portion comprises a light entering region; wherein a size of the light sensor chip in a width direction of the frame of the mobile terminal is a thickness of the light sensor chip;

wherein the display module comprises a display screen and a transparent cover plate covering the display screen, the transparent cover plate is fixed to the frame in a bonding manner, the optical package assembly is disposed in accommodation space formed by the transparent cover plate and the housing and is located between the frame and the display screen in the width direction of the frame of the mobile terminal, an orthogonal projection of the optical package assembly onto the transparent cover plate does not overlap an orthogonal projection of the display screen onto the transparent cover plate, and a light sensing region of the light sensor chip faces to the frame;

wherein the protection portion is a sealing compound portion, the sealing compound portion is transparent glue, the sealing compound portion comprises the light entering region, a light entering direction of the light entering region intersects with an orientation of a light sensing region of the light sensor chip, a first reflector is disposed in the sealing compound portion, and the first reflector is used to receive ambient light that enters the light entering region, and reflect the ambient light to the light sensing region;

or, wherein the protection portion is a package cover, the package cover has an inner cavity, the light sensor chip is disposed in the inner cavity, the package cover comprises the light entering region, a light entering direction of the light entering region intersects with an orientation of a light sensing region of the light sensor chip, a second reflector is disposed in the inner cavity, and the second reflector is used to receive ambient light that enters the light entering region, and reflect the ambient light to the light sensing region.

2. The mobile terminal according to claim 1, wherein the plane on which the light sensor chip is located is perpendicular to the plane of the substrate.

3. The mobile terminal according to claim 1, wherein the substrate is a circuit board, the light sensor chip comprises a pin, the pin is welded to a pad of the substrate by using solder, and the pin is electrically connected to the substrate.

4. The mobile terminal according to claim 3, wherein the pin is a bump protruding from a surface on one side of the light sensor chip.

5. The mobile terminal according to claim 1, wherein the mobile terminal is a smartphone, a tablet computer, or a wearable device.

* * * * *